(12) United States Patent
Maeritz

(10) Patent No.: US 7,348,187 B2
(45) Date of Patent: Mar. 25, 2008

(54) METHOD, DEVICE, COMPUTER-READABLE STORAGE MEDIUM AND COMPUTER PROGRAM ELEMENT FOR THE MONITORING OF A MANUFACTURING PROCESS OF A PLURALITY OF PHYSICAL OBJECTS

(75) Inventor: Jörn Maeritz, Zeiler/Nittendorf (DE)

(73) Assignee: Infineon Technologies AG, Munich (DE)

( * ) Notice: Subject to any disclaimer, the term of this patent is extended or adjusted under 35 U.S.C. 154(b) by 35 days.

(21) Appl. No.: 10/706,612

(22) Filed: Nov. 12, 2003

(65) Prior Publication Data

US 2004/0241885 A1  Dec. 2, 2004

(30) Foreign Application Priority Data

Nov. 12, 2002  (DE) ............................... 102 52 614

(51) Int. Cl.
*H01L 21/00* (2006.01)

(52) U.S. Cl. ................. 438/14; 438/17; 438/5

(58) Field of Classification Search ........... 438/14, 438/17, 5
See application file for complete search history.

(56) References Cited

U.S. PATENT DOCUMENTS

| | | | |
|---|---|---|---|
| 5,422,724 A | 6/1995 | Kinney et al. | |
| 6,202,037 B1 | 3/2001 | Hattori et al. | 702/182 |
| 6,233,494 B1 | 5/2001 | Aoyagi | 700/121 |
| 6,365,423 B1 * | 4/2002 | Heinlein et al. | 438/14 |
| 6,427,093 B1 | 7/2002 | Toprac | 700/121 |
| 6,647,309 B1 * | 11/2003 | Bone | 700/121 |
| 6,885,955 B1 * | 4/2005 | Atchison | 702/81 |
| 6,909,933 B2 * | 6/2005 | Maeritz | 700/121 |
| 7,016,750 B2 * | 3/2006 | Steinkirchner et al. | 700/103 |
| 7,027,943 B2 * | 4/2006 | Steinkirchner et al. | 702/81 |
| 2002/0062162 A1 | 5/2002 | Bunkofske et al. | 700/108 |
| 2002/0155629 A1 * | 10/2002 | Fairbairn et al. | 438/14 |
| 2004/0225396 A1 * | 11/2004 | Maeritz | 700/109 |
| 2004/0236528 A1 * | 11/2004 | Steinkirchner et al. | 702/83 |
| 2004/0241885 A1 * | 12/2004 | Maeritz | 438/5 |
| 2004/0243456 A1 * | 12/2004 | Maeritz | 705/8 |
| 2005/0004827 A1 * | 1/2005 | Steinkirchner et al. | 705/8 |
| 2006/0019415 A1 * | 1/2006 | Jaiswal et al. | 438/14 |
| 2007/0020782 A1 * | 1/2007 | Rathei | 438/14 |

FOREIGN PATENT DOCUMENTS

DE    198 47 631 A1    10/1998

OTHER PUBLICATIONS

C. Lakshminarayan, "Overview of outlier methods in SC manufacturing", TI Technical Journal, pp. 54-56, Oct.-Dec. 1998.
Examination Report issued in counterpart European application No. EP 03 02 6038 on Feb. 10, 2006.

* cited by examiner

Primary Examiner—Laura M. Schillinger
(74) Attorney, Agent, or Firm—Brinks Hofer Gilson & Lione

(57) ABSTRACT

In the case of the method, an analysis is performed by using values of at least one process parameter of the manufacturing process of the physical object and, as a result of the analysis, when they satisfy a prescribed selection criterion, physical objects are marked in such a way that the associated physical objects can be taken as a random sample for the monitoring of the manufacturing process.

8 Claims, 3 Drawing Sheets

METHOD, DEVICE, COMPUTER-READABLE STORAGE MEDIUM AND COMPUTER PROGRAM ELEMENT FOR THE MONITORING OF A MANUFACTURING PROCESS OF A PLURALITY OF PHYSICAL OBJECTS

FIELD OF THE INVENTION

The invention relates to a method, a device, a computer-readable storage medium and a computer program element for the monitoring of product quality data in a manufacturing process.

BACKGROUND OF THE INVENTION

In the manufacture of wafers with highly integrated semiconductor chips, the ever-increasing miniaturization of the structures on the semiconductor chip are responsible in particular for imposing ever greater requirements on the production installations and manufacturing processes used for the manufacture of the semiconductor chips. The stability and reproducibility both of the production installations and of the manufacturing processes decisively influence the yield and productivity during semiconductor chip production. Even small deviations from a prescribed form of behavior of a chip production installation during production can lead to considerable worsening of the yield (i.e. a considerable increase in the defect rate of the semiconductor chips manufactured).

To ensure the quality of the manufacturing process and the quality of the wafers, the wafers must be subjected to test measurements once processing of them has been completed. To monitor and assess the manufacturing process completely, it would be necessary to test each individual wafer which has been produced by means of the manufacturing process and subsequently to assess the quality of the wafer. However, this is not possible due to the time- and cost-intensive test measurements for determining the quality of the wafers.

According to the prior art, this is resolved by statistically (i.e. randomly selecting individual wafers as random samples from a lot of wafers after completion of the manufacturing process). This method is usually referred to as a "Statistical Process Control" (SPC) method. Test measurements are subsequently carried out on this random sample. Within the application, these test measurements are also referred to as SPC measurements. On the basis of the results of the test measurements, a statement is then made concerning the quality of all the wafers of the lot. It is assumed here that wafers which are representative of the overall lot are selected. For example, any two wafers of the lot are selected. It is assumed that the quality of the overall lot will then fluctuate about the measured values of the quality. The values determined in this way are used both for the determination of the cp value, which is a statement of the range of a distribution of the measured values, or in other words a measure of the smallest possible proportion of defective units (wafers) in the process that is expected when the position of the distribution is centered. The values are also used for the determination of the cpk value, which is a value which indicates how centrally the distribution of the measured values lies in relation to a prescribed specification, or in other words a measure of the expected proportion of defective units in the process.

Although this procedure has the advantage that it can be carried out quickly and at low cost, it has the disadvantage that in the case of this procedure the ascertained quality of the wafers is subject to chance events. If in the arbitrary selection of the random sample a wafer of poor quality is taken, the poor quality is ascribed to the overall lot. Conversely, it may also be the case that an overall lot is classified as meeting specific quality criteria if by chance an item of high quality, i.e. a wafer that has been processed with above-average quality, is taken for the test measurement for determining the quality.

The fluctuations which are caused by the random selection also have the effect that, in the method according to the prior art, the determination of the cp value and of the cpk value is also only possible unsatisfactorily.

Consequently, according to the prior art, quality values of wafers and of the manufacturing process are subject to statistical fluctuations about which no statements can be made. The statement depends on the random selection of the tested wafer. Consequently, the cp values of the manufacturing process and the cpk values of the manufacture are also subject to uncertainties. To obtain statements concerning the soundness of the quality assessment or to make the quality assessment statistically more significant, the number of wafers that are subjected to the test measurement would have to be increased.

C. K. Lakshminarayan in an article "Overview of outlier methods in SC Manufacturing" (TI Technical Journal 1998) discloses an overview of methods for detecting outliers in semiconductor manufacture is given.

U.S. Pat. No. 5,422,724 discloses a method for reducing targeting errors encountered when trying to locate contaminant particles on a wafer in a high-magnification imaging device.

German Patent Publication DE 198 47 631 discloses a quality management system in which a data processing unit processes a data value measured by a defect inspection device, such as for example the number of defects, a surface area of each defect, an equivalent diameter of the surface area, etc., in such a way that index values are calculated as processed data values and used by a judgment unit as a basis for judging whether or not further testing is to be carried out.

The invention is based on the problem of increasing the informative value of the quality monitoring measurement of a lot of wafers.

In the case of a method for the monitoring of a manufacturing process of a plurality of physical objects, an analysis is performed by using values of at least one process parameter of the manufacturing process of the physical object. As a result of the analysis, when they satisfy a certain selection criterion, physical objects are marked in such a way that the associated physical objects can be taken as a random sample for the monitoring of the manufacturing process (i.e. SPC measurements can be carried out on the sample for monitoring the quality of the physical object).

A process parameter is to be understood in this connection as meaning a parameter of a manufacturing process of a physical object. These include, for example, in the manufacture of a wafer the misalignment (i.e. the inaccuracy of the positioning of a wafer in a machine, or in other words a deviation of an actual position of the wafer in the machine from the prescribed position of the wafer in the machine), within a positioning step, the temperature during a process step, the gas flow during a process step, the time duration of a process step, the pressure prevailing during a process step, generally all valve positions, a wafer carrier speed and a wafer carrier contact pressure. Other process parameters in lithography are, for example, various alignment variables, a focusing or a dose. These process parameters are constantly measured during the manufacturing process and are available for an analysis.

The analysis may be a statistical analysis. It may, however, also investigate individual values or evaluate simple statements, for example whether or not a physical object satisfies a certain requirement (good—no good).

The device for the monitoring of a manufacturing process of a physical object has at least one processor, which is set up in such a way that the method steps described above can be carried out.

In a computer-readable storage medium, a processing program for the monitoring of a manufacturing process of a physical object is stored, which processing program has the method steps described above when it is run by a processor.

A computer program element for the monitoring of a manufacturing process of a physical object has the method steps described above when it is run by a processor.

The invention can be realized both by means of a computer program, i.e. software, and by means of one or more special electrical circuits, i.e. in hardware, or in any desired hybrid form, i.e. by means of software components and hardware components.

The invention has the advantage that, by means of the analysis of the process data, a selection criterion is provided for a random sample selection by means of which a random sample which is representative of the overall lot can be determined. It is not the case as in the prior art that a random sample is arbitrarily taken from the lot and subjected to an SPC measurement, but instead those random samples of a product quality typical of the overall lot are selectively taken. The method consequently allows active random sample selection on the basis of process data. By means of the method, consequently a random sample on which an SPC measurement is carried out for ascertaining the quality can be determined, and consequently the overall lot can be characterized in an improved way. The informative value of the quality testing is increased. It is also possible by means of the method according to the invention for the selection of the random samples to be automated.

Preferred developments of the invention emerge from the dependent claims. The further refinements of the invention concern the method and the device for checking the manufacturing process of a physical object, the computer-readable storage medium and the program element.

The physical object is preferably a wafer.

The invention is well-suited in particular in the case of wafer manufacture with its extremely high number of process steps, with very high requirements on the accuracy of the setting of the process parameters, since an automated, improved quality control is realized in a simple way for the first time in this area.

In a preferred development, the analysis is a statistical analysis.

Furthermore, in the case of the method according to the invention, the values of the at least one process parameter are measured when the physical object is being manufactured.

According to one refinement, the physical objects of the random sample are subjected to a quality checking measurement for checking the quality of the respective physical object.

For ascertaining the variation of the qualities of the physical objects, a physical object for which the value of the at least one process parameter has a prescribed difference from the random sample is preferably additionally subjected to a quality checking measurement.

By means of this additional quality checking measurement, it is possible in a simple way to determine the variation of the distribution of the product qualities of the physical objects of a lot by means of a single additional measurement. The prescribed difference is preferably the maximum difference occurring in the distribution of the process parameters. Preferably, the prescribed difference is a difference which corresponds to a $1\sigma$ difference of the distribution.

The analysis preferably comprises the ascertainment of the median of the values of the at least one process parameter.

The median of a distribution of a process parameter is particularly suited for characterizing a lot, since with it values of the process parameter which deviate strongly from the other measured values of the process parameters have no effects. Wafers which produce a value close to the median of the distribution for the process parameter concerned characterize the lot concerned particularly well. As a result, the informative value of a quality checking measurement is increased.

The analysis may comprise the ascertainment of the arithmetic mean value of the values of the at least one process parameter.

The arithmetic mean value likewise characterizes the distribution of the process parameters measured during the manufacture of wafers of a lot. Furthermore, it can be calculated more easily and quickly than the median.

By means of the method according to the invention, a selection criterion which serves the purpose of determining representative wafers of a lot is provided. For this purpose, the median of a distribution of measured values of a process parameter is preferably determined when the individual wafers of a lot are being manufactured. Wafers for which the process parameter concerned has during their manufacture a value close to the median of the distribution of all the measured values of the process parameter characterize the lot concerned particularly well. As a result, the informative value of a quality checking measurement is increased.

If a range of fluctuation of the quality distribution is also to be additionally determined, then not only a random sample which characterizes the median or the arithmetic mean value of the distribution is investigated but also a random sample which characterizes the border of the distribution of the values of the corresponding process parameter. Alternatively, the range of fluctuation may also be determined directly from the distribution of the values of the process parameter. This procedure has the advantage that both the mean value and the range of the quality distribution can be determined directly by means of a single time- and cost-intensive measurement on two wafers. Furthermore, the method according to the invention has the advantage that it is also possible to dispense entirely with the laborious SPC measurements for determining the quality of the wafers if it is evident by means of the process data recorded and statistically evaluated that no deviations have occurred since the last quality measurement that was carried out for a wafer of the same manufacturing process.

Consequently resulting as advantages of the method according to the invention are a reduction in the number of random samples on which quality measurements have to be carried out to obtain the same statistical informative value. Consequently, a reduction in the machine capacity requirement, greater automation of the random sample selection and improved product control are achieved. A further advantage is a greater credibility or reliability of the determination of cp and cpk values of the manufacturing process. This greater reliability of the determination results in turn in the possibility of a more specific intervention in the production sequence, in particular an improved possibility of controlling the course of the process.

Even though the invention is explained in more detail below on the basis of the example of a monitoring method of a wafer manufacturing process, it is pointed out that the invention is not restricted to a wafer manufacturing process but instead can be used in all monitoring methods for manufacturing processes in which process parameters are recorded in the manufacturing process for manufacturing a physical object, for example also in the pharmaceuticals industry in the manufacture of pharmaceutical products.

BRIEF DESCRIPTION OF THE DRAWINGS

An exemplary embodiment of the invention is explained in more detail below and represented in the figures, in which.

DETAILED DESCRIPTION OF THE DRAWINGS

Figure 1:
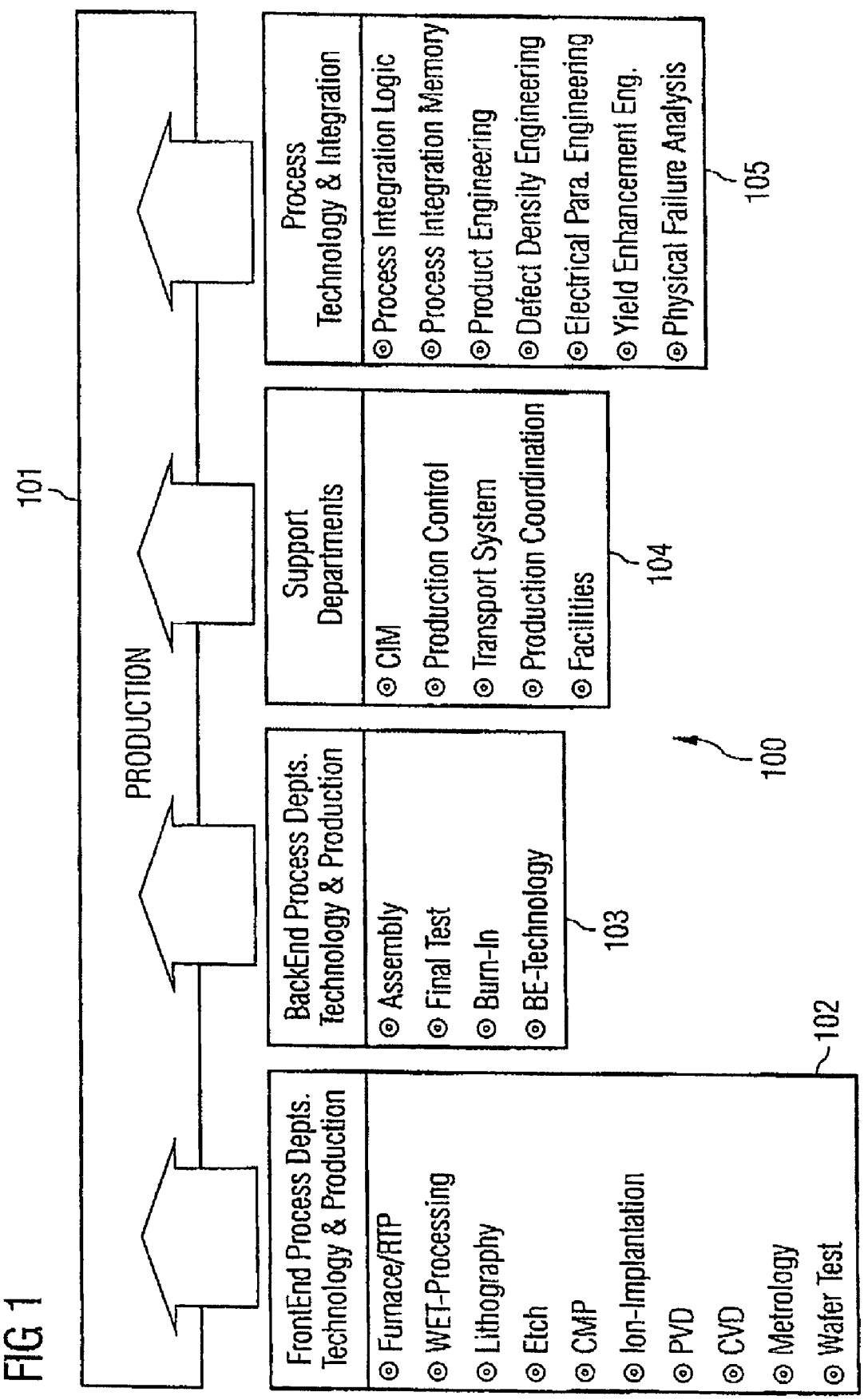
FIG. 1 shows a block diagram in which the general organization of a chip production installation is represented.

By way of introduction, FIG. 1 schematically illustrates in a block diagram 100 the organization and setup of a semiconductor chip production installation, for which a method according to the invention can be used for the monitoring of a manufacturing process of a plurality of wafers.

The overall manufacturing process, referred to in FIG. 1 by a first block 101, is grouped by way of example into four production areas 102, 103, 104, 105, a first area, into which the front-end processes of the chip production are grouped (block 102),
a second area of the manufacturing process, into which the back-end processes are grouped (block 103),
a third area of the manufacturing process, which relates to the support, that is to say the backup, of the individual manufacturing processes (block 104),
a fourth area, which relates to the process technology and the process integration (block 105).

In the case of the front-end processes 102, the following process technologies and the devices set up for carrying out the corresponding processes are provided in particular:

a furnace for heating up the respective wafer to be processed,
a device for carrying out Rapid Thermal Processing (RTP),
a device for etching the wafer, for example for wet-etching or for dry-etching,
a device for cleaning, for example washing, the wafer,
a device for carrying out various lithographic steps,
a device for chemical-mechanical polishing (CMP),
a device for carrying out an ion-implantation in predetermined areas of the wafer or of the chip respectively to be produced,
devices for applying materials to the wafer, for example devices for depositing materials from the vapor phase, that is for example devices for carrying out Physical Vapor Deposition (PVD) or Chemical Vapor Deposition (CDV), or a device for epitaxially growing material on a substrate,
metrology devices, i.e. measuring devices,
devices for carrying out tests on the respective wafers.

The back-end processes relate in particular to the following areas:

the assembly of the chips in packages,
the final test of the finished and packaged chip,
the introduction of information, for example product information, into or onto the package of the respective chip, and also
generally the technologies used in the back-end area for packaged and unpackaged chips.

The support, that is to say the process backup, relates in particular to the following areas:

CIM,
process monitoring,
a transportation system for delivering the finished semiconductor chips,
coordination of production
backup for the respective production sites.

Process technology and process integration relates in particular to the process integration of logic chips,
the process integration of memory chips,
product engineering,
the monitoring and improving of defect densities in manufacture,
the monitoring of electrical parameters in the products manufactured,
enhancement of the yield of the chips manufactured,
a physical failure analysis.

Figure 2:
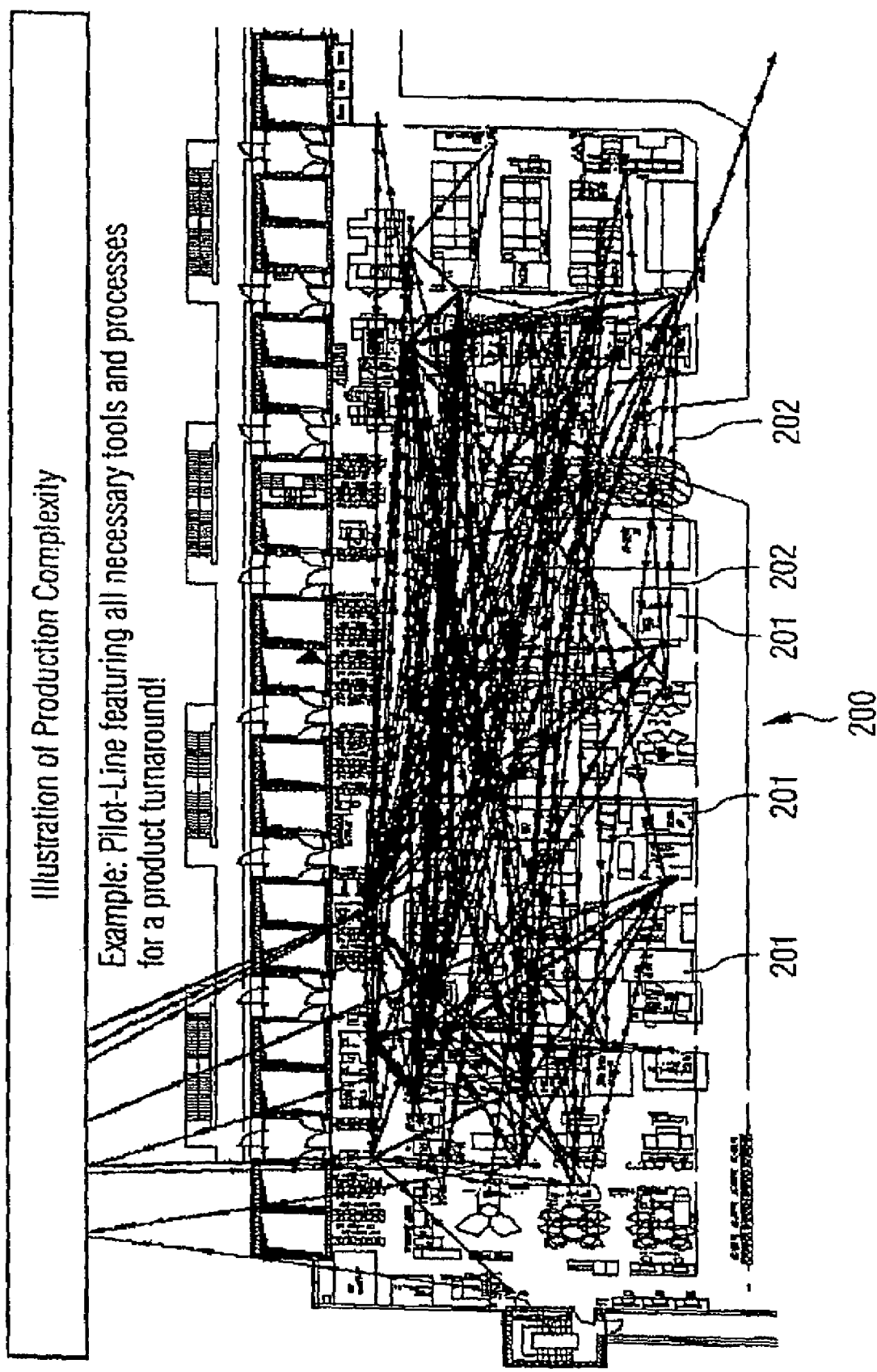
FIG. 2 shows a diagram of a chip production installation, with the complex material flow, i.e. the path of a wafer/lot, through the chip production installation and the associated complex process steps being represented.

FIG. 2 shows a semiconductor chip production installation, in other words a semiconductor chip factory 200, with a multiplicity of semiconductor chip production sub-installations 201, which are used for processing raw materials, for example a silicon wafer or a wafer made of other semiconductor materials (germanium, gallium-arsenide, indium-phosphide, etc.), in order to produce semiconductor chips from the raw materials.

A customary manufacturing process for manufacturing a semiconductor chip has hundreds of different process steps, in which lithographic steps, etching steps, CMP steps, steps for applying materials to the respective wafer to be processed, or else steps for doping or implanting doping atoms in the wafer to be processed are carried out in various sequences. In the case of all these process steps, values of process parameters which can be subjected to a later statistical analysis are recorded.

This results in the paths represented in FIG. 2 by lines 202, which represent the path of a wafer or lot of wafers through the semiconductor chip production installation 200. In the semiconductor chip production installation 200 there are a multiplicity of sensors, which are assigned to the respective sub-production installations 201 and an even greater amount of process data (raw data), which are respectively acquired by the sensors and processed as explained in more detail below, are recorded. A respective sensor may be integrated into a respective machine (integrated sensor) or be attached separately to a respective machine (external sensor).

Hereafter, the production sub-installations 201 are also referred to as machines 201.

Figure 3:
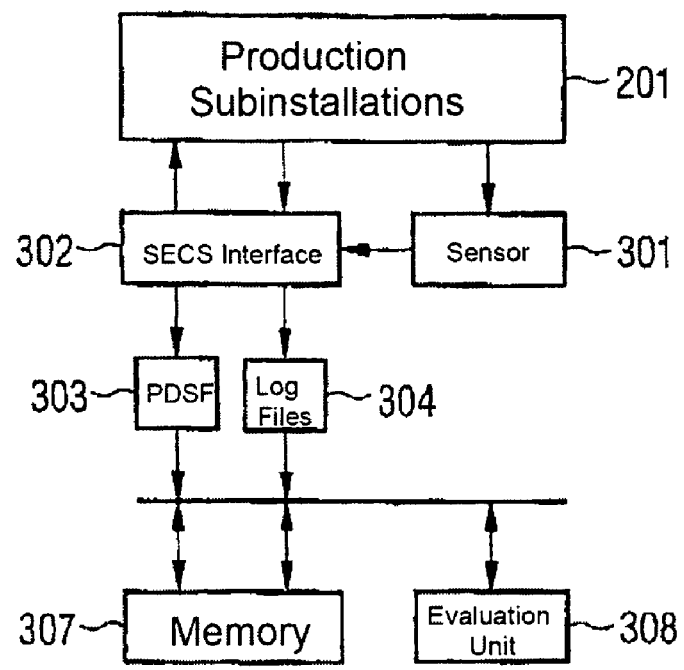
FIG. 3 shows a block diagram in which the process data flow when producing a wafer/lot is represented.

FIG. 3 shows by way of example the data flow for process data, which are acquired on a machine 201 by means of an integrated sensor or by means of an external sensor 301. Each sensor 301, it being possible for any desired number of integrated and/or external sensors to be provided, acquires the parameters of the machine 201 which are respectively predetermined for it, for example physical or chemical states in a process chamber, the position of a robot arm, etc. Examples of process parameters in the manufacture of a wafer are the misalignment, i.e. the positioning inaccuracy, within a positioning step, the temperature during a process step, the gas flow during a process step, the time duration of a process step or the pressure during a process step.

The sensor 301 is coupled via an SECS interface 302, which is set up for data communication according to the SECS standards, to a local communication network (Local Area Network, LAN) 306.

According to the SECS standards, files are generated by the sensor 301 and the SECS interface 302 according to the PDSF format (Process Data Standard Format), also referred to hereafter as PDSF files 303 and also log files 304, the PDSF files 303 and the log files 304 being stored as data in a memory 307.

The PDSF files 303 contain, for example, analog data from different channels, that is to say from different internal (i.e. integrated) and/or external sensors 301, which may be attached to a machine 201. The process data generated are stored in the memory 307.

The memory 307 stores the process data in such a way that they can be assigned to the wafers after completion of the wafers and makes the process data available for later statistical analysis. The statistical analysis is carried out by means of an evaluation unit 308. The statistical analysis of the evaluation unit 308 serves the purpose of providing a selection criterion with the aid of which a random sample can be determined from wafers of a production lot, which random sample is subjected to a subsequent quality control measurement (SPC measurement).

Figure 4:
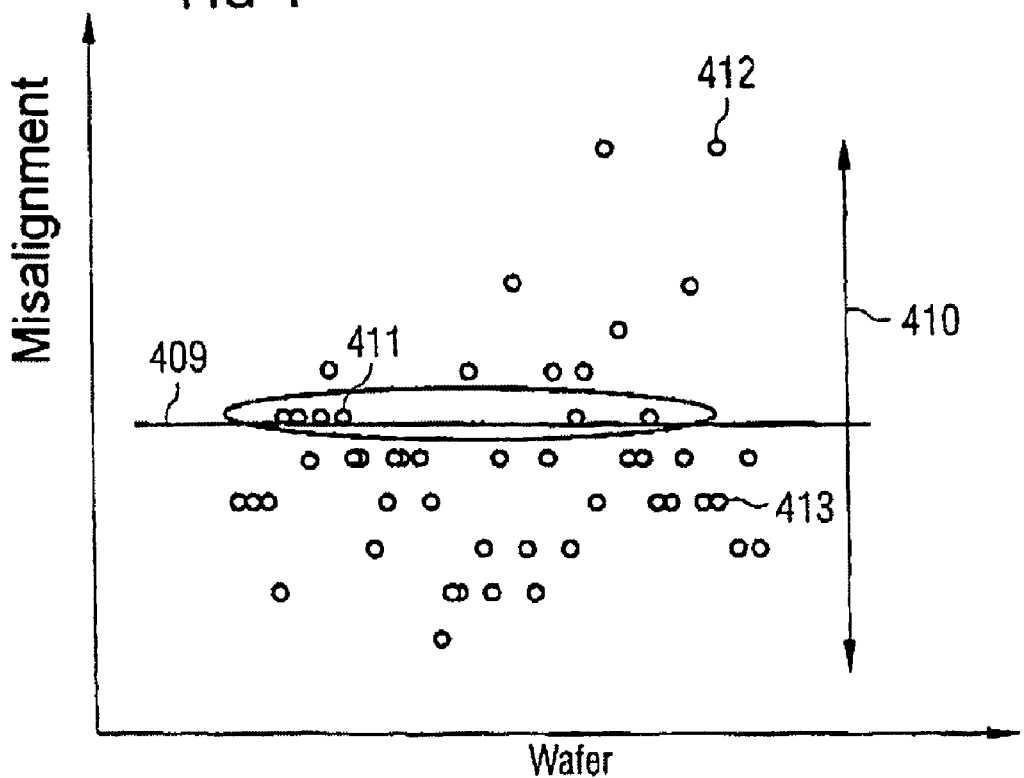
FIG. 4 shows a distribution of values of a process parameter which is used as a selection criterion in a statistical analysis.

Represented in FIG. 4 is a distribution of the values of a process parameter which were recorded in the manufacturing process of a wafer. Chosen as an example was a process parameter which shows the misalignment, i.e. the deviation in the X and/or Y direction from a prescribed position of the wafer, which prescribed position it is intended to assume during processing. The process data represented are on-line process data of a lot in lithography. The process data are acquired during the manufacturing process by an exposure machine and transmitted by means of a LAN network. The variation of the values of the process parameter which can be seen in FIG. 4 shows the natural process variation, i.e. the variation of the alignment quality of the wafers.

The value of the misalignment is determined as a process parameter for each wafer, as described above. It is consequently available without further time-consuming and costly measurement. The distribution of the values of the misalignment of all the wafers of a lot which is to be characterized by means of a quality monitoring test is created by means of a statistical analysis.

In the exemplary embodiment, the misalignment values (process parameters) of all the wafers are entered in a diagram in the statistical analysis. This produces a two-dimensional histogram in which the misalignment values of the wafers are plotted against the wafer numbers. Furthermore, the mean value or median of the process parameter of all the wafers of the lot is calculated by means of the statistical analysis and likewise entered in the two-dimensional distribution. On the basis of this two-dimensional distribution and the corresponding limit value, it can then be investigated by means of the analysis which wafers are particularly suitable for characterizing the lot.

In FIG. 4, the values for a lot comprising 50 wafers are entered. By means of the analysis, the wafers which best characterize the lot in this process parameter are then determined. On a random sample of the wafers which best characterize the lot, test measurements which characterize the quality of the wafer, and consequently the quality of the overall lot, are then subsequently carried out. In the exemplary embodiment, the mean value of all the misalignment values is entered as a horizontal line 409. In addition, the variation 410 of the distribution is entered. For the test measurement, a random sample, generally a single wafer, which lies in its alignment value close to the mean value of the distribution is selected. In FIG. 4, this is, for example, the wafer 411. With the selection of the wafer 411 it is ensured that a typical representative of the lot is taken for characterizing the overall lot. As a further selection criterion in addition to the mean value depicted, the median of the distribution could also be used. The median has the advantage over the arithmetic mean value that the median is not influenced as strongly by wafers which have values for the process parameter used that deviate strongly from the mean value of the process data of the other wafers. That is to say that outliers of the values of the process parameter are not such a strong factor when calculating the median as when calculating the mean value. Consequently, when the median is used as a selection criterion for the selection of the random sample, an improved statement is obtained with respect to the quality of the wafers of a lot.

According to this exemplary embodiment, in addition to the average quality of the lot, the variation of the production qualities is also investigated. For this purpose, in addition to the random sample from the midst of the distribution, a random sample from the border of the distribution is also subjected to a test measurement. In FIG. 4, this would be, for example, the wafer 412, with the maximum distance of the process parameter from the mean value of the process parameter being assumed here as the variation. Alternatively, a 1σ range around the mean value of the distribution may also be assumed, for example, as the variation. In the distribution shown in FIG. 4, this would correspond, for example, to the wafer 413. Alternatively, the variation of the product qualities may also be determined directly from the variation of the distribution.

Representative statements concerning the overall lot can then be obtained by means of a quality investigation measurement of the two wafers 411 and 412. This applies both to the mean value of the distribution and to the variation of the distribution. Informative cp values or cpk values of the manufacturing process can be obtained. Consequently, an overall lot of wafers can be investigated with regard to its quality properties in a simple manner. The required number of time- and cost-intensive test measurements is minimized. According to the invention, the variation can also be determined directly by means of the on-line process data.

If it is evident from the on-line data of the process parameters that no change has occurred in the manufacturing process in comparison with a test measurement which was carried out on wafers produced by means of the same manufacturing process, the number of wafers which are subjected to a test measurement can be reduced further.

To sum up, the invention provides a method and a device for the monitoring of the product quality of a physical object in a manufacturing process in which a random sample of physical objects is selected by means of recorded data of process parameters and a statistical analysis, which sample is used in a subsequent test measurement for determining the quality of the physical object. By means of this SPC measurement, the overall lot can subsequently be characterized. The method according to the invention has the advantage over the prior art that a substantiated statement concerning the production quality of an overall lot can be made with little expenditure on test measurements. Consequently, advantages of the method according to the invention are, for example, a reduction in the number of random sample measurements required, and consequently a reduction in the machine capacity requirement, an improvement in the process and product control and greater automation of the sample selection. The method according to the invention allows for the first time an active random sample selection on the basis of process data. By means of the method, the entirety of a lot is characterized, and not just one more or less representative random sample. If on-line measured values of a manufacturing process are evaluated for the monitoring of the manufacturing process, as is the case for example with APC (Advanced Process Control), it is possible to indicate which wafer characterizes the distribution of the on-line measured values particularly well.

The invention claimed is:

1. A method for monitoring a manufacturing process comprising:

performing an analysis by using values of at least one process parameter of the manufacturing process of a plurality of physical objects;

determining one physical object from the plurality of physical objects which best characterizes the plurality of physical objects, based on the analysis of the at least one process parameter; and selecting the one physical object which best characterizes the plurality of physical objects, for monitoring the manufacturing process.

2. The method as claimed in claim 1, in which the physical object is a wafer.

3. The method as claimed in claim 1 or 2, in which the analysis is a statistical analysis.

4. The method as claimed in one of claims 1 to 3, in which the values of the at least one process parameter are measured when the physical object is being manufactured.

5. The method as claimed in one of claims 1 to 4, in which the physical object selected is subjected to a quality checking measurement for checking the quality of the respective physical object.

6. The method as claimed in claim 5, in which, for ascertaining the variation of the qualities of the physical objects, a physical object for which the value of the at least one process parameter has a prescribed difference from the physical object selected is additionally subjected to a quality checking measurement.

7. The method as claimed in claim 1 or 6, in which the statistical analysis comprises the ascertainment of the median of the values of the at least one process parameter.

8. The method as claimed in claim 1 or 7, in which the statistical analysis comprises the ascertainment of the arithmetic mean value of the values of the at least one process parameter.

* * * * *